(12) United States Patent
Chen et al.

(10) Patent No.: US 8,132,052 B2
(45) Date of Patent: Mar. 6, 2012

(54) SYSTEM AND METHOD FOR LOCATING A FAULT ON A DEVICE UNDER TEST

(75) Inventors: Yulong Chen, Shenzhen (CN); Hong Guan, Shenzhen (CN); Gaile Lin, Shenzhen (CN)

(73) Assignee: CSR Technology Inc., San Jose, CA (US)

( * ) Notice: Subject to any disclaimer, the term of this patent is extended or adjusted under 35 U.S.C. 154(b) by 0 days.

(21) Appl. No.: 12/299,246

(22) PCT Filed: Jun. 12, 2008

(86) PCT No.: PCT/CN2008/001137
§ 371 (c)(1),
(2), (4) Date: Oct. 31, 2008

(87) PCT Pub. No.: WO2009/149583
PCT Pub. Date: Dec. 17, 2009

(65) Prior Publication Data
US 2011/0078505 A1    Mar. 31, 2011

(51) Int. Cl.
*G06F 11/00* (2006.01)
(52) U.S. Cl. .................. 714/32; 714/25; 714/28; 714/45

(58) Field of Classification Search .............. 714/25, 714/28, 32, 33, 37, 45, 46
See application file for complete search history.

(56) References Cited

U.S. PATENT DOCUMENTS 5,845,064 A * 12/1998 Huggins .................. 714/33
(Continued)

FOREIGN PATENT DOCUMENTS

CN            101047738 A       10/2007
(Continued)

*Primary Examiner* — Robert Beausoliel, Jr.
*Assistant Examiner* — Joseph D Manoskey
(74) *Attorney, Agent, or Firm* — Pillsbury Winthrop Shaw Pittman LLP

(57) ABSTRACT

System and method for analyzing operation of a device under test (DUT). In one embodiment, a reference component associated with a reference device may be received. The reference device may be in communication with the DUT and a component associated with the DUT can be exchanged with the reference component. A test may be performed on the DUT, wherein a result of the test may correspond to a source of a fault associated with the DUT. An indication of the source of the fault may be provided based on the test result.

20 Claims, 5 Drawing Sheets

U.S. PATENT DOCUMENTS

| | | | |
|---|---|---|---|
| 5,923,567 A * | 7/1999 | Simunic et al. | 714/30 |
| 7,873,874 B2 * | 1/2011 | Choate et al. | 714/45 |
| 2005/0071109 A1 * | 3/2005 | DeFelice et al. | 702/120 |
| 2006/0067239 A1 | 3/2006 | Olinski | |
| 2006/0248390 A1 * | 11/2006 | Hori et al. | 714/28 |

FOREIGN PATENT DOCUMENTS

| | | |
|---|---|---|
| CN | 101056216 A | 10/2007 |
| CN | 101159498 A | 4/2008 |
| WO | WO 2008/000290 | 1/2008 |

\* cited by examiner

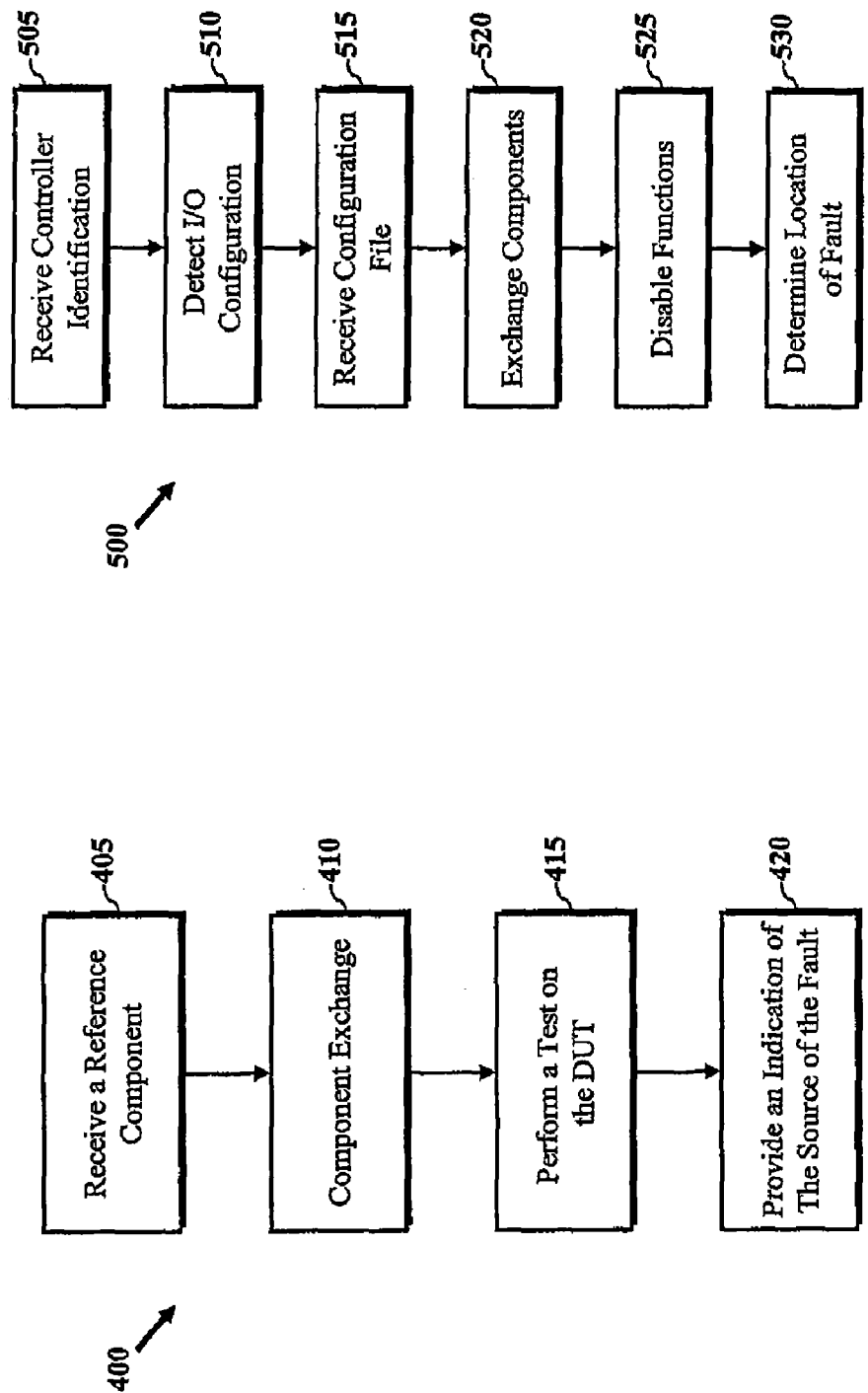

SYSTEM AND METHOD FOR LOCATING A FAULT ON A DEVICE UNDER TEST

CROSS REFERENCE TO RELATED APPLICATION

This application claims priority to International Application No. PCT/CN2008/001137 filed Jun. 12, 2008.

FIELD OF THE INVENTION

The present invention relates in general to device testing and more particularly to identifying the source of a fault associated with a device under test (DUT).

BACKGROUND

Electronic media players, such as DVD players, high definition media players, audio receivers, etc., have enjoyed long-standing popularity in recent times. Recent advances in processing have added new features and reduced costs for media players.

In the electronics industry, many conventional media players, and electronic devices in general, utilize processors operating with hardware components. These media players however, may be susceptible to manufacturing defects and/or design bugs for various reasons. In one example, interoperation of a processor with hardware components may result in one or more operation errors in such devices. Further, testing is typically not performed for each of these manufactured devices. As a result, some of these devices may include one or more of a hardware and software fault. Locating the source of a fault may be very time consuming and expend many resources. Accordingly, there exists a need to provide a means for locating a source of faulty operation for electronic devices.

Conventional methods of testing electronic devices typically perform tests on the faulty device as a whole. Such methods may not accurately asses the operation of a device due to the possibility of a plurality of faults. Further, such conventional methods can be labor intensive and may be difficult to locate a fault. Thus, while there have been efforts to test electronic devices, such efforts do not provide a sufficient method of isolating a fault location in an electronic device.

Thus there is an unsatisfied need for a system and method for locating a fault in an electronic device.

BRIEF SUMMARY OF THE INVENTION

Disclosed and claimed herein are a system and method for analyzing operation of a device under test (DUT). In one embodiment, a method includes receiving a reference component associated with a reference device, wherein the reference device is in communication with the DUT, exchanging a component associated with the DUT with the reference component and performing a test on the DUT. A result of the test can correspond to a source of a DUT fault. An indication related to the source of a fault can be provided based on the test result.

Other aspects, features, and techniques of the invention will be apparent to one skilled in the relevant art in view of the following detailed description of the invention.

BRIEF DESCRIPTION OF THE DRAWINGS

FIG. 4 depicts a process of locating the source of a fault according to one or more embodiments of the invention;

FIG. 5 depicts a process of locating the source of a fault according to one or more embodiments of the invention.

DETAILED DESCRIPTION OF EXEMPLARY EMBODIMENTS

Figure 1:
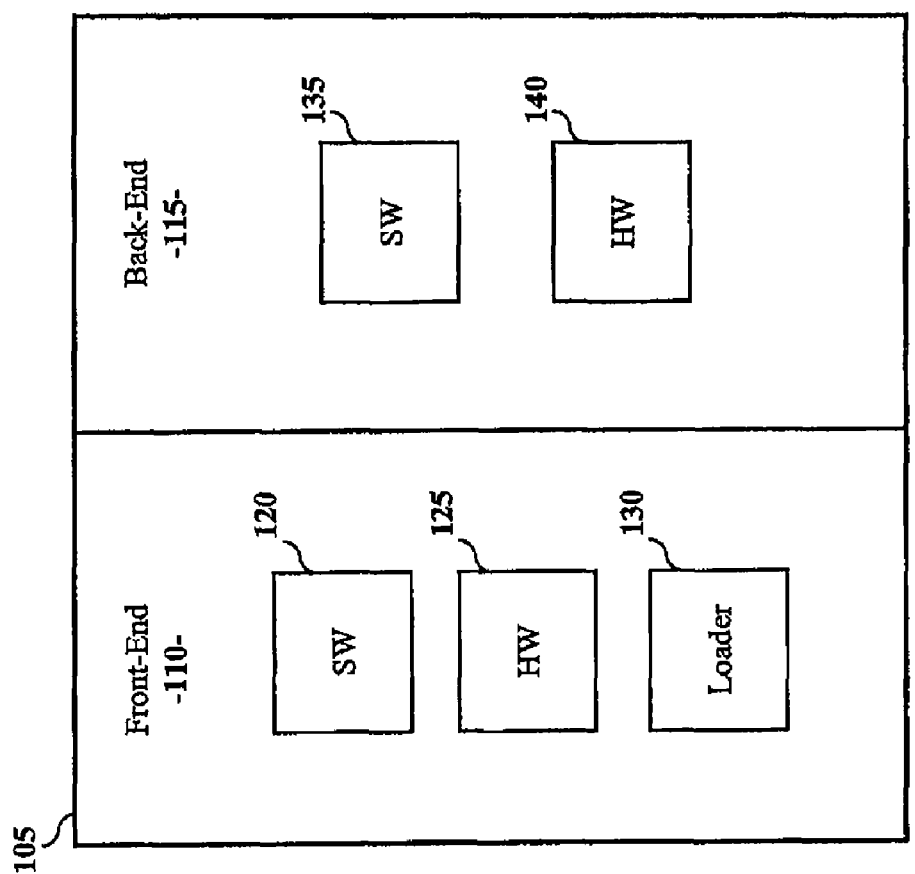
FIG. 1 depicts a graphical representation of a device under test according to one or more embodiments of the invention.

The present invention is generally directed to locating the source of a fault associated with a device under test (DUT). In certain embodiments, components of the DUT may be tested on the DUT. Additionally, components of the DUT may be tested using a reference device associated with the DUT.

One aspect of the invention is to provide a system for testing a DUT. In one embodiment, the system may include a testing unit coupled to a DUT such that the testing unit can exchange components of the DUT with at least one reference component. For example, code segments associated with the testing unit may be exchanged with reference code segments. According to another embodiment, the reference components may be associated with a reference device and/or may be stored in memory. The testing unit may be configured to exchange components of the DUT and reference components to locate the source of a fault of the DUT. Further, the testing unit may be configured to test components of the DUT on the reference device according to another embodiment. According to one embodiment, a fault may relate to at least one of an error in DUT output and an operational error of the DUT. It should be appreciated that the testing unit may be configured to test electronic devices in a multitude of forms including a compact disc player, video disc player, media player in general, application specific integration chip, system on a chip, loader module, etc.

According to another embodiment of the invention, a process may be provided for locating the source of a fault associated with a DUT. In one embodiment, the process may include receiving a reference components associated with a reference device and exchanging a component of the DUT with the reference component. Exchange of the reference component may be based on the section of the DUT to be analyzed. The process may include providing an indication of the source of a fault associated with a DUT. Similarly, the process may include testing components of the DUT on a reference device. In certain embodiments, components of the DUT may be isolated for testing one or more operation characteristics of the DUT.

Another aspect of the invention relates to a process for locating faults in a DUT having a components which may be characterized as having front-end and back-end components. For example, a DVD player may be configured to include front-end processing components and back-end processing components. In one embodiment of the invention, a process may be provided for determining the location of a fault based on testing one or more of the front-end components and the back-end components. Similarly, a process may be provided for locating faults for system-on-chip and/or systems having front-end and back-end components in general.

When implemented in software, the elements of the invention are essentially the code segments to perform the necessary tasks. The program or code segments can be stored in a processor readable medium. The "processor readable medium" may include any medium that can store or transfer information. Examples of the processor readable medium include an electronic circuit, a semiconductor memory device, a ROM, a flash memory or other non-volatile memory, a floppy diskette, a CD-ROM, an optical disk, a hard disk, etc. The code segments may be downloaded via computer networks such as the Internet, Intranet, etc.

Referring now to the drawings, FIG. 1 illustrates a graphical representation of a DUT according to one or more embodiments of the invention. In certain embodiment, a DUT may be characterized as including front-end and back-end components. As shown in FIG. 1, a DUT 105 is represented as having front-end 110 and back-end 115 sections. It may be appreciated that front-end 110 and back-end 115 may relate to an abstraction of the functions provided by the DUT for separating components of the DUT 105. As such, front-end 110 and back-end 115 may each perform one or more distinct functions for the DUT 105. However, it should also be appreciated that front-end 110 and back-end 115 may relate to distinct components and/or modules of the DUT 105.

In one embodiment, DUT 105 may relate to an electronic device such as a compact disc player, video disc player, media player in general, etc. According to another embodiment, DUT 105 can relate to a controller such as a such as a processor, microprocessor, field programmable gate array (FPGA), system-on-a-chip (SoC) and/or application specific integrated circuit (ASIC) of an electronic device. As shown in FIG. 1, components of DUT 105 are shown as distinct components, however it should be appreciated that teachings of one or more embodiments of the invention may be applied to a DUT which may not be divided into front-end and back-end components.

In one embodiment, front-end 110 may relate to components configured to collect input in various forms from a user or other device and process the received data to conform to a specification. Front-end 110 may include software components 120 and hardware components 125. Software components 120 may relate to processor executable instructions for operating or controlling hardware components 125. In certain embodiments, when DUT 105 relates to a disk player, such as a DVD player, hardware components 125 may include read/write components, a servo, servo control components and/or a data processor. Additionally, hardware components 125 may include read/write means for decoding and/or encoding data. According to another embodiment, front-end 110 may include a loader 130 configured to provide data generated and/or detected by front-end 110 to back-end 215. In one embodiment, loader 130 may include hardware and software components. Software components of loader 130 may be used to format and/or handle data for back-end 115.

Back-end 115 may relate to components configured to decode, encode and/or process data received from front-end 110. It may also be appreciated that back-end components may receive data from a user input and/or graphical user interface (GUI). As shown in FIG. 1, back-end 115 can include software components 135 and hardware components 140. It may be appreciated that software components 135 and hardware components 140 may interoperate to provide one or more functions, such as high definition decoding and display, time shifting, up conversion, progressive and interlaced scanning, etc. In certain embodiments, software components 135 can relate to executable instructions for hardware components 140. In a further embodiment, hardware components 140 may include a processor coupled to a memory such as a microprocessor, field programmable gate array (FPGA) and/or application specific integrated circuit (ASIC).

While DUT 105 has been described has having front-end and back-end components, it should equally be appreciated that DUT 105 may relate to other configurations.

Figure 2:
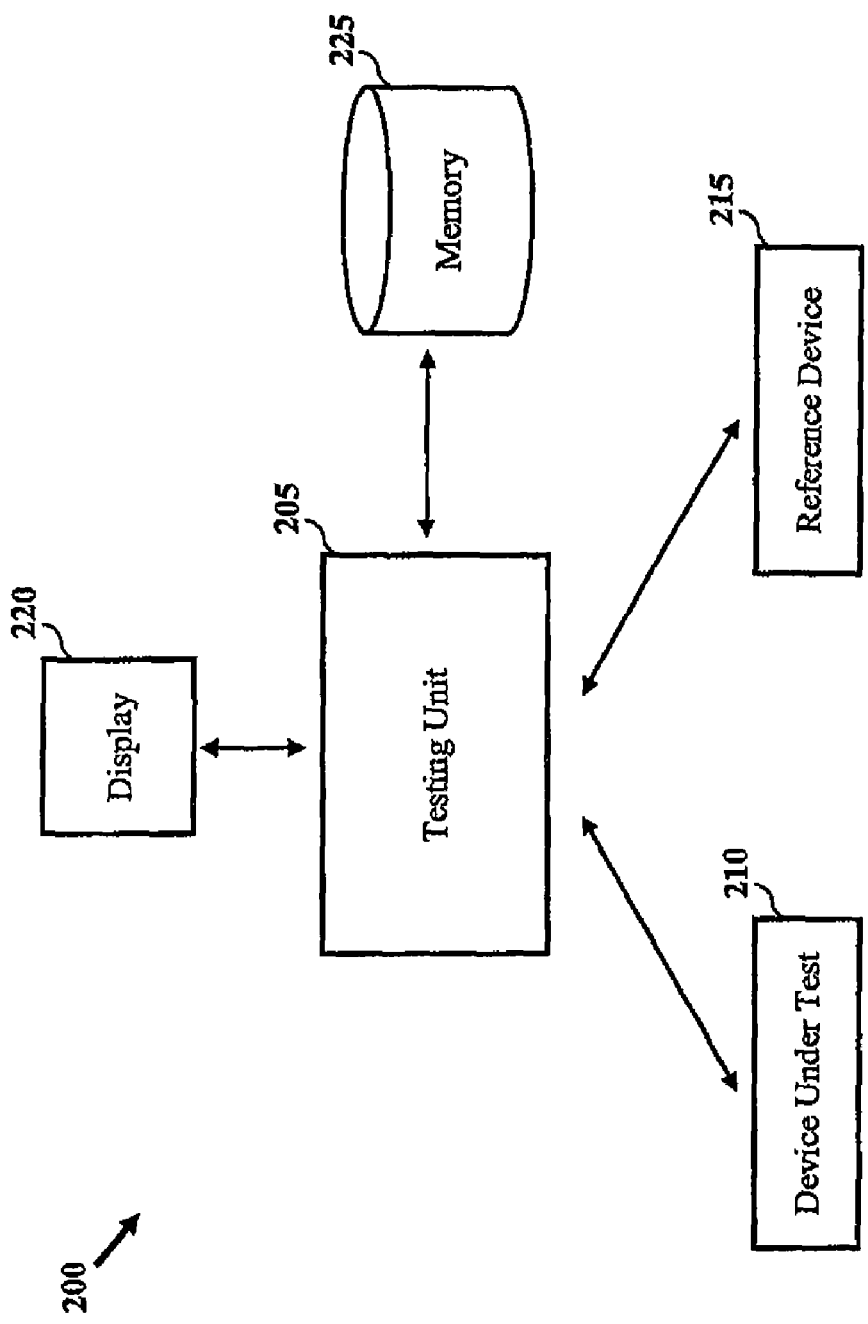
FIG. 2 depicts a simplified system diagram of a system according to one or more embodiments of the invention.

Referring now to FIG. 2, a simplified block diagram is shown of a system which may be used to test a DUT, such as DUT 105 of FIG. 1, according to one or more embodiments of the invention. As shown in FIG. 2, system 200 includes a testing unit 205 coupled to a DUT 210. According to one embodiment, testing unit 205 may be configured to exchange one or more components of DUT 210 with reference components to determine the source of a fault. In one embodiment, reference components may be stored by memory 225 and/or reference device 215. Reference components may relate to front-end and/or back-end components associated with DUT 210. In certain embodiments, the reference components may be based on a model and series of a controller associated with DUT 210. It may also be appreciated that the reference components may relate to one or more of hardware and machine readable code elements, such as software. According to another embodiment, reference components may be provided by a reference device 215. For example, a component of the reference device 215 may be tested on the DUT 210 through a component exchange operation performed by testing unit 205. Alternatively, a component of DUT 210 may be tested on reference device 215. For example, testing unit 205 may be configured to perform one or more test routines including generation of test patterns.

A result of a test performed by testing unit 205 may be displayed using display 220. According to another embodiment, display 220 may be used to display a graphical user interface provided by testing unit 205. System 200 may also include memory 225 to store processor executable instructions of testing unit 205. In yet another embodiment, memory 225 may be configured to store a log of results from at least one test performed by testing unit 205.

Figure 3:
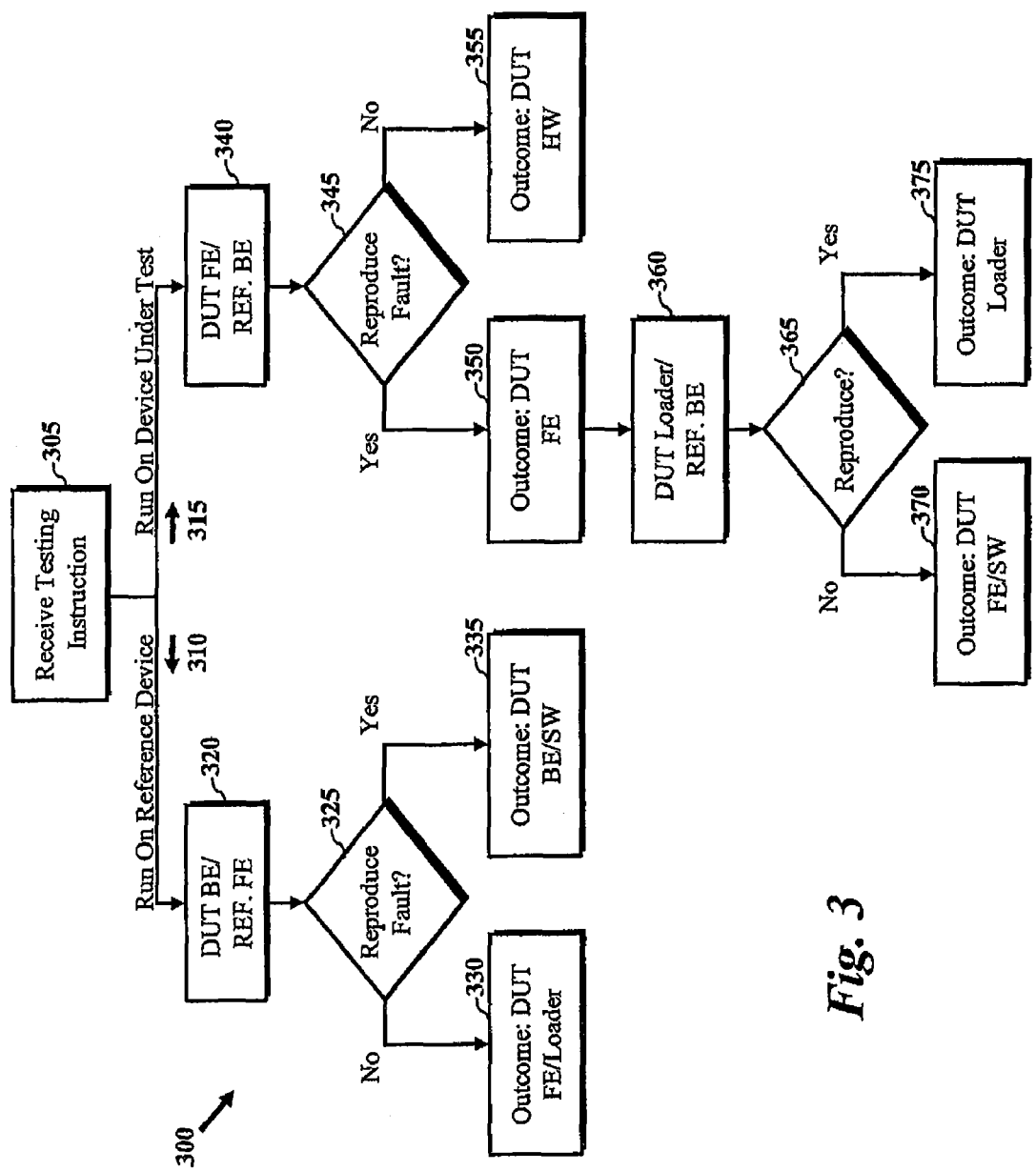
FIG. 3 depicts a process of locating the source of a fault according to one or more embodiments of the invention.

Referring now to FIG. 3, process 300 is shown for locating the source of a fault, according to one or more embodiments of the inventions. In one embodiment, process 300 may be utilized to locate the source of a detected fault. As such, process 300 may seek to reproduce, or not reproduce, such a fault to determine the location of the fault. Alternatively, process 300 may be utilized for determining correct operation of a DUT. Process 300 may be initiated by receiving a instruction by a testing unit (e.g., testing unit 205) at block 305. According to one embodiment of the invention, components of a DUT (e.g., DUT 210) may be exchanged with components of a reference device (e.g., reference device 215) based, in part, on an instruction received at block 305. As shown in FIG. 3, path 310 of process 300 relates to testing components on a reference device. Alternatively, components of a reference device may be exchanged with components of the DUT. As such, path 315 relates to testing components on a DUT according to another embodiment. In certain embodiments, process 300 may include testing a reference device and DUT serially, such that one of paths 310 and 315 is performed at a time. It may also be appreciated that testing of paths 310 and 315 may be performed in parallel such that each of paths 310 and 315 may be executed. In that fashion, it may be determined if a DUT exhibits a fault in operation and/or output.

When a testing unit performs a test of the DUT on a reference device, shown by path 310, back-end components of the reference device may be exchanged with back-end components of the DUT (shown as DUT BE in FIG. 3) at block 320, according to one embodiment. In that fashion, back-end components of the DUT may be tested with front-end components of the reference device (shown as REF. FE in FIG. 3). The testing unit can perform one or more tests to determine if an operational fault of the DUT was reproduced at block 325. When a test performed by the testing unit does not result in a fault being reproduced (e.g., "No" path out of decision block 325), the testing unit can conclude that the fault may be localized to the DUT front-end and/or loader (shown as DUT FE/Loader in FIG. 3) at block 330. Additional tests may be performed by the testing unit as will be discussed in more detail below. When a test performed by the testing unit does result in a fault being reproduced (e.g., "Yes" path out of decision block 325), the testing unit can conclude that the fault may based on DUT back-end and/or back-end software (shown as DUT BE/SW in FIG. 3) at block 335. To that end, components of the DUT may be tested on a reference device to determine the source of a DUT fault.

When the testing unit performs a test on the DUT device, shown by path 315, back-end components of the DUT may be exchanged with back-end components of the reference device (shown as REF. BE in FIG. 3) at block 340, according to one embodiment. In that fashion, back-end components of the reference device may be tested with front-end components of the DUT (shown as DUT FE in FIG. 3). The testing can then perform one or more tests and determine if a fault of the DUT was reproduced at block 345. When a test performed by the testing unit on the DUT does not result in a fault reproduced (e.g., "No" path out of decision block 325), the testing unit can conclude that a fault may be attributed to back-end hardware of the DUT (shown as DUT HW in FIG. 3) at block 355. When a test performed by the testing unit does result in a fault reproduced (e.g., "Yes" path out of decision block 345), the testing unit can conclude that the fault may based on the front-end components of the DUT (shown as DUT FE in FIG. 3) at block 350.

Continuing to refer to FIG. 3, process 300 may include a test of the DUT loader and back-end components of the reference device (shown as REF. BE in FIG. 3). In that fashion, a loader of the DUT (shown as DUT Loader in FIG. 3) may be tested with back-end components of the reference device at block 360. The testing unit can then perform one or more tests and determine if a fault can be reproduced at block 365. When a test performed by the testing unit on the DUT does not result in a fault being reproduced (e.g., "No" path out of decision block 365), the testing unit can conclude that a fault may be attributed to DUT front-end and/or software (shown as DUT FE/SW in FIG. 3) at block 370. When a test performed by the testing unit does result in a fault reproduced (e.g., "Yes" path out of decision block 365), the testing unit can conclude that the fault may based on the loader of the DUT at block 375.

While process 300 has been described as testing DUT components associated with a reference device, it may be appreciated that the reference components may be retrieved from memory (e.g., memory 225) for testing on the DUT. To that end, components of the DUT may be tested to provide a source of one or more faults of the DUT. It may also be appreciated that additional tests may be employed to further locate a DUT fault.

Referring now to FIG. 4, a process is shown which may be employed by the testing unit of FIG. 2, according to one or more embodiments of the invention. Process 400 may be initiated by a testing unit (e.g., testing unit 205) receiving a reference component at block 405. For example, at least one of front-end of back-end components may be received by the testing unit. Reference components may be based on a particular model of the DUT and/or a controller of the of a DUT (e.g., DUT 210). In that fashion, a reference component may be chosen which relates to and/or may be associated with DUT. A component of the DUT may be exchanged with the reference component at block 410. In certain embodiments, exchange of a DUT component with a reference component may be based on performed by an application interface program as will be described below in more details with reference to FIG. 5. The testing unit may perform a test on the DUT at block 415. The testing unit may then provide an indication of the source of a fault based on one or more tests performed by the testing unit at block 420. In certain embodiments, further tests may be required to determine the source of a fault.

Referring now to FIG. 5, a process is shown according to another embodiment of the process of FIG. 4. As shown in FIG. 5, process 500 may be utilized for locating the source of a fault of a DUT (e.g., DUT 210). Process 500 may be initiated by receiving identification data of a DUT, by a testing unit (e.g., testing unit 205), at block 505. For example, identification data may relate to one of a series and model of a DUT (e.g., DUT 210) controller. A chip or controller associated with the DUT may include various pin outputs and settings based on one or more of a model and series of the controller. In that fashion, a reference device may be chosen which relates to the controller. The identification data may be entered by a user using a GUI as will be described in more detail below with respect to FIG. 6. An I/O configuration for the DUT may be detected by the testing unit at block 510. In certain embodiments, I/O pins may be indicated by a user. It may also be appreciated that I/O pins may be detected by the testing unit.

According to one embodiment, a configuration file may be employed to exchange processor executable functions of the DUT. A configuration file may be received by the testing unit at block 515. In one embodiment, the configuration file may correspond to and application programming interface.

According to another embodiment, process 500 may include validating that the configuration file corresponds to a correct file based on the DUT identification. Configuration files may be associated with particular components and/or pin configurations of a DUT. Based on the configuration file and the detected I/O configuration of the controller, components of the controller may be exchanged with components of a reference controller at block 520. In one embodiment, components exchanged at block 520 may relate to controller code.

According to another embodiment, functions of the DUT may be disabled at block 525. In certain embodiments, functions may be disabled to aid in locating the source of a fault. The testing unit may then determine the location of a source of fault based on one or more tests performed by the testing unit at block 530. In one embodiment, the DUT may be tested using predefined input. According to another embodiment, functionality of the DUT may be evaluated to determine proper operation of the device.

Figure 6:
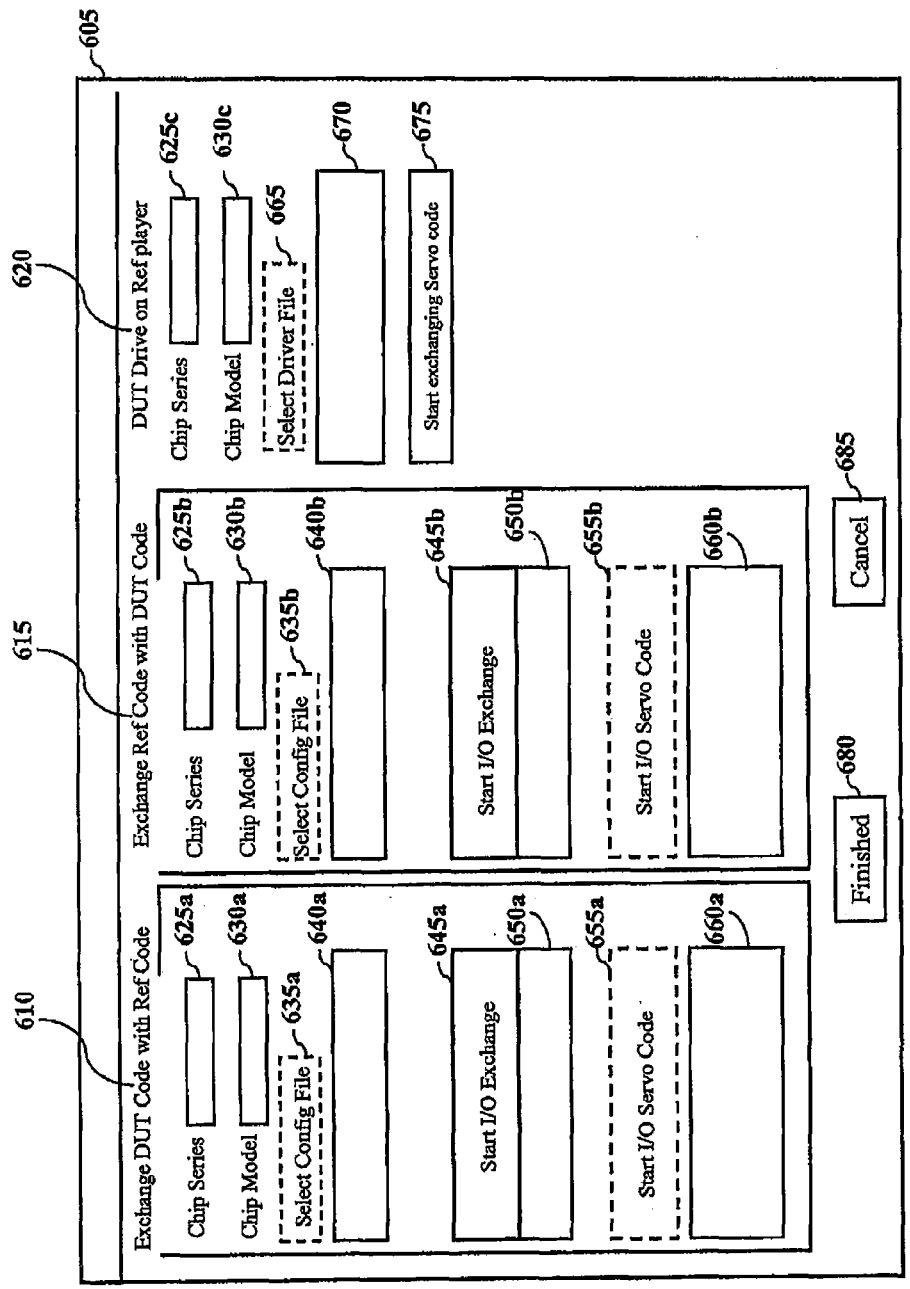
FIG. 6 depicts a representation of a graphical user interface according to one or more embodiments of the invention.

Referring now to FIG. 6, a graphical representation is shown of a graphical user interface (GUI) according to one or more embodiments of the invention. According to one embodiment, a user may employ GUI 605 to enter data associated with a DUT (e.g., DUT 210), initiate a test of the DUT and/or receive results of a test result performed by a testing unit. In another embodiment, GUI 605 may be utilized to select one or more components for exchange with a DUT. Additionally, GUI 605 may include one or more display areas to provide progress messages, error notification messages, completion messages, etc. As shown in FIG. 6, section 610 may be associated with exchanging DUT code to a reference device. According to another embodiment, section 615 may be associated with exchanging reference components to a DUT. Section 620 may be associated with exchanging drive components of reference player with a DUT drive.

In one embodiment, GUI 605 may be employed by a user to enter data such as a DUT series, into a one or more of fields 625a-625c, and DUT model, into one or more of fields 630a and 630b. According to another embodiment, configuration files for the DUT may be selected by terminals 635a-635c. Once a configuration file is selected, a message and/or the file name can be displayed in one of display windows 640a and 640b. Similarly, when a driver file may be selected by terminals 665 and displayed in display window 675.

Continuing to refer to FIG. 6, terminals 645a and 645b may be used to initiate exchange of processor readable code of the DUT and reference device. Display windows 650a and 650b may be employed to provide messages of the related to the exchange. According to another embodiment, GUI 605 may include terminals 655a and 655b may be used to initiate exchange of processor readable code associated with the servo code of the DUT and reference device. A selected configuration file may be displayed in display windows 660a and 660b. Similarly, GUI 605 may include terminal 675 to exchange of DUT servo code associated with DUT and reference device. Servo code test may be monitored using display window 670.

In that fashion, data entered using GUI 605 may be employed to determine the source of a fault associated with a DUT. For example, a DUT model 625a, DUT series 630a and configuration file 640a may be employed for exchanging a DUT component with a reference component associated with section 610 of GUI 605. A result of the test may be displayed in display window 650a based on a component selected using terminal 645a. Similarly, a selected servo code 660a of a DUT may be exchanged with a reference component. A result of the test may be displayed in display window 660a based on a servo component selected using terminal 655a. It may be appreciated that testing in sections 610 and 615 may be performed in parallel or in series.

According to another embodiment, GUI 605 may includes terminal 680 to complete testing and terminal 685 to cancel functions of a testing unit using GUI 605.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Trademarks and copyrights referred to herein are the property of their respective owners.

What is claimed is:

1. A method for analyzing operation of a device under test (DUT) comprising the acts of:
   receiving a reference component associated with a reference device, wherein the reference device is in communication with the DUT;
   exchanging a component of the DUT with the reference component associated with the reference device;
   performing a test on the DUT, wherein a result of the test corresponds to a source of a fault associated with the DUT; and
   providing an indication of the source of the fault based, at least in part, on the test result.

2. The method of claim 1, wherein the reference component relates to one of a front-end component and back-end component.

3. The method of claim 1, wherein the reference component relates to processor executable instructions.

4. The method of claim 1, wherein exchanging the component comprises:
   receiving an application interface program; and
   initiating the application interface program to exchange the component with the reference component.

5. The method of claim 1, wherein the test result relates to detecting a fault in at least one of DUT operation and DUT output.

6. The method of claim 1, further comprising receiving identification data associated with the DUT using a graphical user interface, the identification data useable to determining an input/output configuration for the DUT.

7. The method of claim 1, further comprising:
   performing an additional test using the reference device, wherein a result of the additional test is useable to indicate the source of a DUT fault.

8. A system for testing components of a device under test (DUT), the system comprising:
   a reference device; and
   a testing unit configured to couple the DUT and the reference device, wherein the testing unit is configured to:
      receive a reference component associated with the reference device;
      exchange a component of the DUT with the reference component;
      perform a test on the DUT, wherein a result of the test corresponds to a source of a fault associated with the DUT; and
      provide an indication of the source of the fault based, at least in part, on the test result.

9. The system of claim 8, wherein the reference component relates to one of a front-end component and back-end component.

10. The system of claim 8, wherein the reference component relates to processor executable instructions.

11. The system of claim 8, wherein the testing unit is further configured to:
   receive an application interface program; and
   initiate the application interface program to exchange the component with the reference component.

12. The system of claim 8, wherein the test result relates to detecting a fault in at least one of DUT operation and DUT output.

13. The system of claim 8, wherein the testing unit is further configured to receive identification data associated with the DUT using a graphical user interface, the identification data useable to determining an input/output configuration for the DUT.

14. The system of claim 8, wherein the testing unit is further configured to:
   perform an additional test using the reference device, wherein a result of the additional test is useable to indicate the source of a DUT fault.

15. A computer program product comprising:
   a non-transitory computer readable medium having computer executable program code embodied therein to analyze operation of a device under test (DUT), the computer executable program product having:
      computer executable program code to receive a reference component associated with a reference device, wherein the reference device is in communication with the DUT;
      computer executable program code to exchange a component of the DUT with the reference component associated with the reference device;
      computer executable program code to perform a test on the DUT, wherein a result of the test corresponds to a source of a fault associated with the DUT; and computer executable program code to provide an indication of the source of the fault based, at least in part, on the test result.

16. The computer program product of claim 15, wherein the reference component relates to one of a front-end component and back-end component.

17. The computer program product of claim 15, wherein the reference component relates to processor executable instructions.

18. The computer program product of claim 15, wherein computer executable program code to exchange the reference component further comprises:
   computer executable program code to receive an application interface program; and
   computer executable program code to initiate the application interface program to exchange the component with the reference component.

19. The computer program product of claim 15, wherein the test result relates to delecting a fault in at least one of DUT operation and DUT output.

20. The computer program product of claim 15, further comprising:
   computer executable program code to perform an additional test using the reference device, wherein a result of the additional test is useable to indicate the source of a DUT fault.

* * * * *

UNITED STATES PATENT AND TRADEMARK OFFICE
CERTIFICATE OF CORRECTION

| | | |
|---|---|---|
| PATENT NO. | : 8,132,052 B2 | Page 1 of 1 |
| APPLICATION NO. | : 12/299246 | |
| DATED | : March 6, 2012 | |
| INVENTOR(S) | : Chen et al. | |

It is certified that error appears in the above-identified patent and that said Letters Patent is hereby corrected as shown below:

In Column 1, Line 38, delete "asses" and insert -- assess --, therefor.

In Column 4, Line 1, delete "described has" and insert -- described as --, therefor.

In Column 10, Line 5, in Claim 19, delete "delecting" and insert -- detecting --, therefor.

Signed and Sealed this
Twelfth Day of February, 2013

Teresa Stanek Rea
*Acting Director of the United States Patent and Trademark Office*